(12) United States Patent
Ichige et al.

(10) Patent No.: US 7,528,046 B2
(45) Date of Patent: May 5, 2009

(54) METHOD FOR MANUFACTURING SEMICONDUCTOR DEVICE

(75) Inventors: Masayuki Ichige, Yokohama (JP);
Makoto Sakuma, Kuwana (JP);
Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/676,814

(22) Filed: Feb. 20, 2007

(65) Prior Publication Data

US 2007/0196986 A1 Aug. 23, 2007

(30) Foreign Application Priority Data

Feb. 21, 2006 (JP) ............................. 2006-044072

(51) Int. Cl.
*H01L 21/336* (2006.01)
*H01L 21/76* (2006.01)
*H01L 21/3205* (2006.01)

(52) U.S. Cl. .............................. 438/296; 257/E21.027; 438/424; 438/585; 438/587

(58) Field of Classification Search ................. 438/266, 438/296; 257/140, 494–495
See application file for complete search history.

(56) References Cited

U.S. PATENT DOCUMENTS

2003/0054642 A1* 3/2003 Kagotani et al. ............ 438/689
2004/0217411 A1* 11/2004 Ohtani et al. ............... 257/314
2005/0073007 A1* 4/2005 Chen et al. .................. 257/355
2006/0077702 A1 4/2006 Sugimae et al.
2007/0170489 A1* 7/2007 Fang et al. .................. 257/314
2007/0196986 A1 8/2007 Ichige et al.

FOREIGN PATENT DOCUMENTS

JP 10-154802 6/1998

OTHER PUBLICATIONS

U.S. Appl. No. 11/851,078, filed Sep. 6, 2007, Sakuma et al.

* cited by examiner

*Primary Examiner*—Hsien-ming Lee
*Assistant Examiner*—Kevin Parendo
(74) *Attorney, Agent, or Firm*—Oblon, Spivak, McClelland, Maier & Neustadt, P.C.

(57) ABSTRACT

A method for manufacturing a semiconductor device including a substrate, a memory cell region including first pattern, first guard ring around the memory cell, second guard ring around the first guard ring, an isolation region between the first and second guard ring, and a peripheral circuit region around the second guard ring and including second pattern, the method including exposing the resist film by multiple exposure including first and second exposures for forming latent images corresponding to the first and second patterns, a boundary area of the multiple exposure being set on the isolation region, on the first or second guard ring, or on an area between the first guard ring and the memory cell region, forming a resist pattern by developing the resist film, and etching the substrate with the resist pattern as a mask.

9 Claims, 11 Drawing Sheets

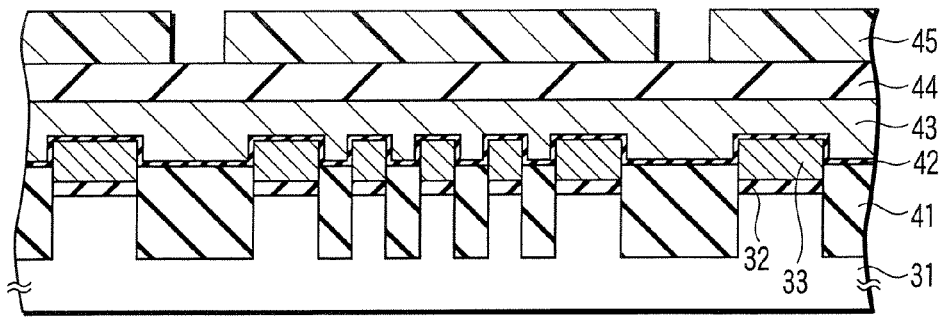
F I G. 13
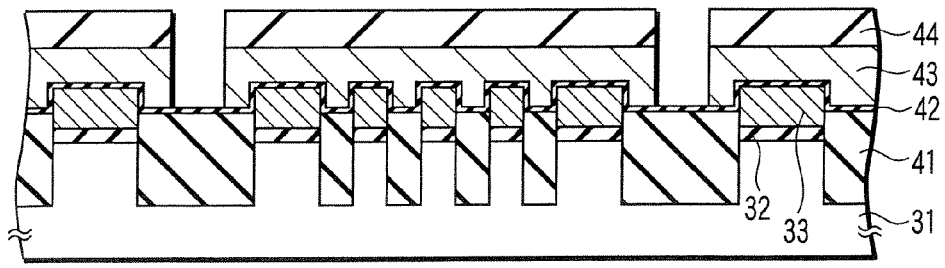
F I G. 14
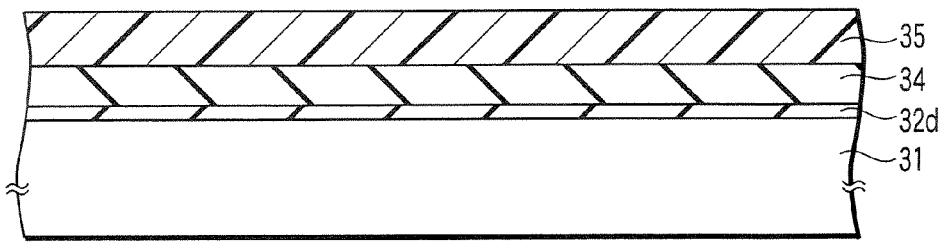
F I G. 15
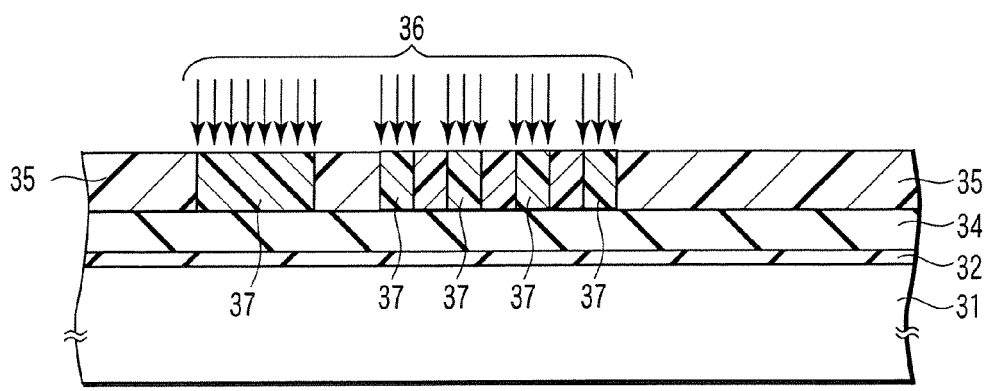
F I G. 16

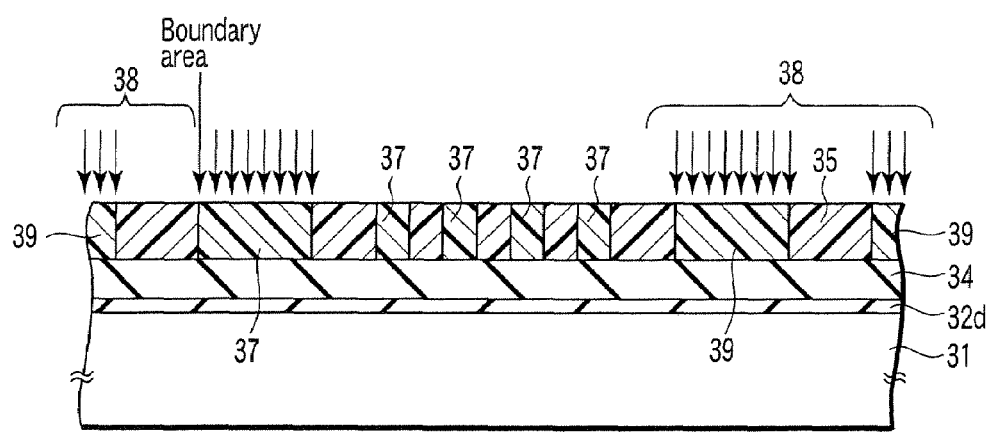
F I G. 17
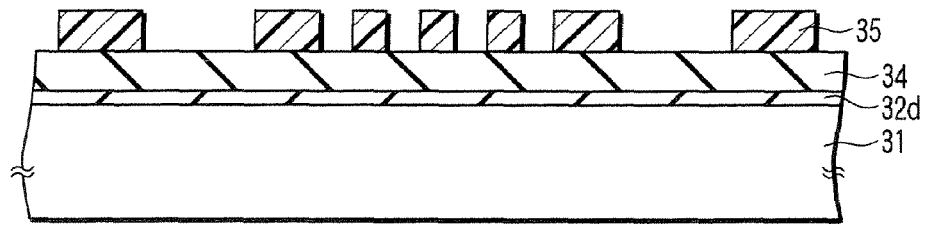
F I G. 18
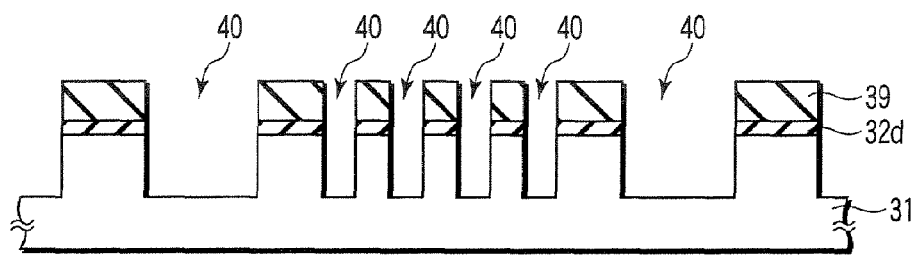
F I G. 19
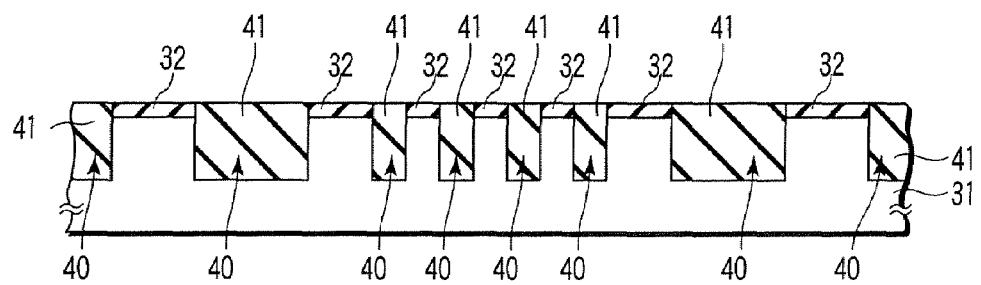
F I G. 20

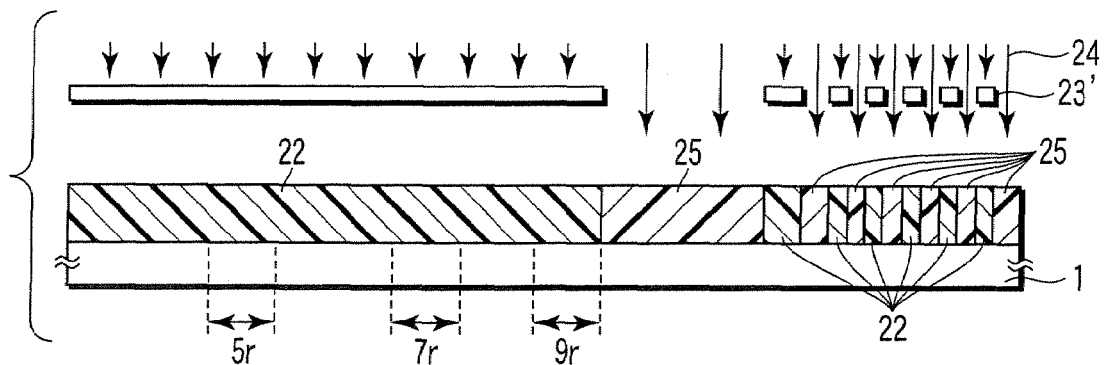
F I G. 26A
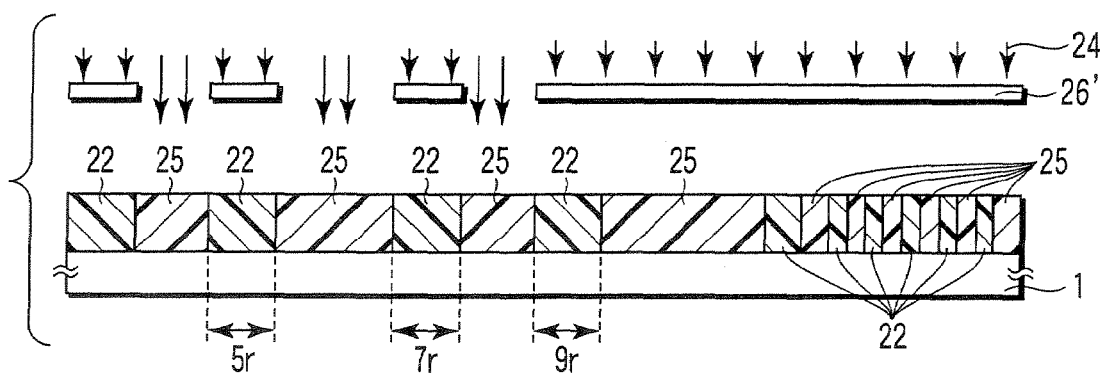
F I G. 26B
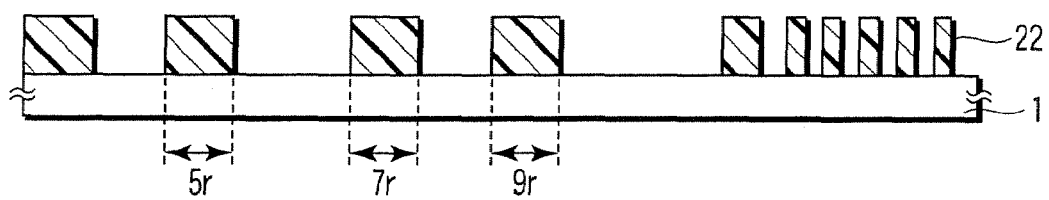
F I G. 26C

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2006-044072, filed Feb. 21, 2006, the entire contents of which are incorporated herein by reference.

BACKGROUND OF THE INVENTION

1. Field of the Invention

The present invention relates to a method for manufacturing a semiconductor device using multiple exposure.

2. Description of the Related Art

A nonvolatile semiconductor memory is exemplified as one of semiconductor memory devices. In recent years, there has been a growing demand for the nonvolatile semiconductor memory used as a data storage device. A NOR-type flash memory or a NAND-type flash memory is known as a typical nonvolatile semiconductor memory.

In order to increase memory capacities of these flash memories, downsizing of an element device is carried out. In particular, the NAND-type flash memory is advantageous in downsizing, and thus, increasing its capacitance is underway.

The NAND-type flash memory comprises a memory cell section and a periphery circuit section provided at the periphery of the memory cell section. The memory cell section comprises a comparatively simple and periodic line and space pattern (L&S pattern). The L&S pattern is suitable for downsizing. Therefore, the performance of an exposure apparatus is improved, thereby making it possible to form a memory cell section that includes dense and large capacitance memory cells. On the other hand, the peripheral circuit section is not suitable for downsizing because it generally comprises an irregular pattern.

In a process for forming a pattern of a general memory device, the memory cell section and the peripheral circuit section are exposed at the same time to form a circuit pattern (Jpn. Pat. Appln. KOKAI Publication No. 10-154802). Therefore, the downsizing of the pattern in the memory cell section is limited by the pattern forming capability of the peripheral circuit section.

BRIEF SUMMARY OF THE INVENTION

According to an aspect of the present invention, there is provided a method for manufacturing a semiconductor device, the semiconductor device comprising a substrate to be processed, a memory cell region provided on the substrate and including a first pattern, a first guard ring provided on a surface of the substrate around the memory cell, a second guard ring provided on the surface of the substrate around the first guard ring, an isolation region provided on the substrate between the first guard ring and the second guard ring, and a peripheral circuit region provided on the substrate around the second guard ring and including a second pattern, the method comprising: forming a resist film on the substrate; exposing the resist film by multiple exposure including a first exposure for forming a latent image corresponding to the first pattern in the resist film; and a second exposure for forming a latent image corresponding to the second pattern in the resist film, a boundary area of the multiple exposure being set on the isolation region, on the first or second guard ring, or on an area between the first guard ring and the memory cell region; forming a resist pattern by developing the resist film; and etching the substrate with the resist pattern as a mask.

According to another aspect of the present invention, there is provided a method for manufacturing a semiconductor device, the semiconductor device comprising a substrate to be processed, a memory cell region provided on the substrate and including a first pattern, a first guard ring provided on a surface of the substrate around the memory cells, a second guard ring provided on the surface of the substrate around the first guard ring, an isolation region provided on the substrate between the first guard ring and the second guard ring, and a peripheral circuit region provided on the substrate around the second guard ring and including a second pattern, the method comprising: forming a resist film on the substrate; exposing the resist film by multiple exposure including a first exposure for forming a latent image corresponding to the first pattern in the resist film on the memory cell region; and a second exposure for forming a latent image corresponding to the second pattern in the resist film on the peripheral circuit region, the first exposure comprising arranging a first mask for forming the first pattern above the resist film and irradiating the resist film with light via the first mask, the second exposure comprising arranging a second mask for forming the second pattern above the resist film and irradiating the resist film with light via the second mask, a boundary area of the multiple exposure being set so that an area of the resist film irradiated with the light by the first exposure and an area of the resist film irradiated with the light by the second exposure fail to overlap each other; forming a resist pattern by developing the resist film; and etching the substrate with the resist pattern as a mask.

BRIEF DESCRIPTION OF THE SEVERAL VIEWS OF THE DRAWING

FIG. 13 is a cross-sectional view showing manufacturing process of the NAND-type flash memory of the third embodiment following FIG. 12;

FIG. 14 is a cross-sectional view showing manufacturing process of the NAND-type flash memory of the third embodiment following FIG. 13;

FIG. 15 is a sectional view showing a manufacturing process of a NAND-type flash memory according to a fourth embodiment of the present invention;

FIG. 16 is a cross-sectional view showing manufacturing process of the NAND-type flash memory of the fourth embodiment following FIG. 15;

FIG. 17 is a cross-sectional view showing manufacturing process of the NAND-type flash memory of the fourth embodiment following FIG. 16;

FIG. 18 is a cross-sectional view showing manufacturing process of the NAND-type flash memory of the fourth embodiment following FIG. 17;

FIG. 19 is a cross-sectional view showing manufacturing process of the NAND-type flash memory of the fourth embodiment following FIG. 18;

FIG. 20 is a cross-sectional view showing manufacturing process of the NAND-type flash memory of the fourth embodiment following FIG. 19;

FIGS. 26A to 26C are sectional views each showing process for manufacturing a NAND-type flash memory according to an eighth embodiment of the present invention.

DETAILED DESCRIPTION OF THE INVENTION

Figure 1:
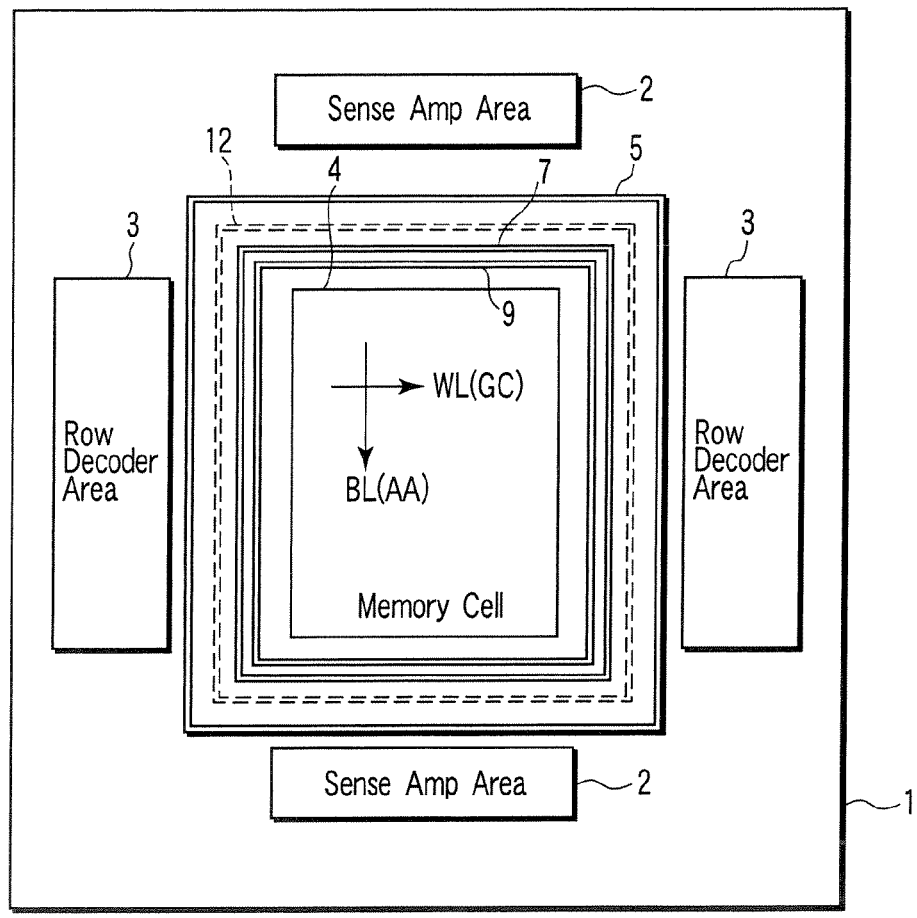
FIG. 1 is a plan view of a NAND-type flash memory according to a first embodiment of the present invention.

Now, embodiments of the present invention will be described with reference to the accompanying drawings.

First Embodiment

As described above, in the case of exposing memory cells and a peripheral circuit simultaneously, the downsizing of a pattern of a memory cell section is limited by the pattern forming capability of a peripheral circuit section.

In order to avoid this, it is thought that the memory cell section and the peripheral circuit section are separately exposed (double exposure). The memory cell section is exposed under a condition optimized therefor, and the peripheral circuit section is also exposed under a condition optimized therefor.

However, in the case of double exposure, there occurs inconvenience that a boundary area between the memory cell section and the peripheral circuit section is exposed twice or is not exposed at all. Further, an area that should be essentially interrupted from light in the boundary area (light shielding area) may be irradiated with leakage light. In this case, an unexpected pattern is formed on the light shielding area. Such a pattern is inconvenient for forming a particularly fine pattern.

That is, in a pattern forming method using double exposure, the following problem occurs depending on how the pattern in the boundary area is formed.

In the case where the peripheral circuit section is set at a position that is sufficiently close to the memory cell section, the memory cell section is photo-sensed by the leakage light produced in the exposure step of the peripheral circuit section. As a result, the dimensional precision of a fine pattern of the memory cell section deteriorates, and memory cells malfunction or its characteristics deteriorate. That is, a problem that a faulty NAND-type flash memory is manufactured occurs.

Such a problem can be solved by setting the peripheral circuit section at a position that is sufficiently distant from the memory cell section.

However, in this case, a band-shaped area (unexposed area) that is neither exposed in accordance with the exposure step of the memory cell section nor the exposure step of the peripheral circuit is formed at the outer periphery of the memory cell section. If the size of the unexposed area is large, a chip size increases, so that its original purpose of promoting downsizing using double exposure is not achieved. Further, the unexposed area described above may become an obstacle in forming an element device or wiring.

Hereinafter, an embodiment considering such a problem associated with double exposure will be described.

The present embodiment relates to a way of setting a boundary area of double exposure.

Now, by way of example of a NAND-type flash memory, a description will be given to a boundary area of a layer (active area forming layer) in which an active area is formed by means of double exposure.

In an actual process, a boundary area is defined for each of layers other than the active area forming layer, each of which is formed by double exposure. Examples of the layer other than the active area forming layer include a layer (gate electrode forming layer) in which a gate conductor layer (CG layer) is formed. The above CG layer is, for example, a gate electrode, a floating gate electrode, or a control gate electrode.

Figure 3:
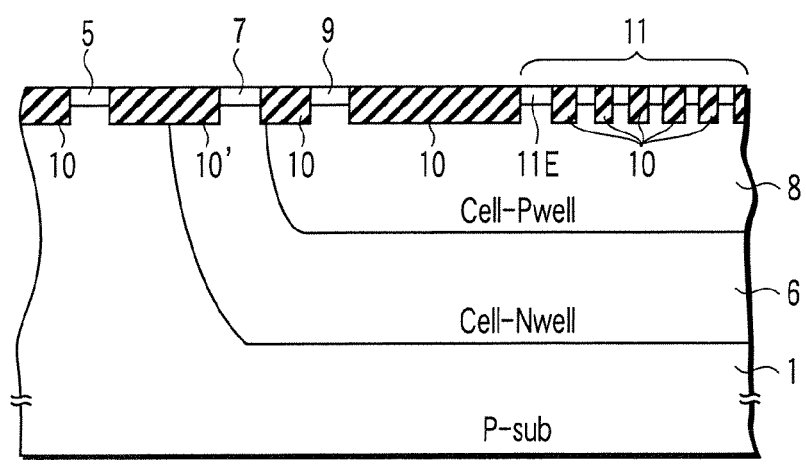
FIG. 3 is a sectional view of the NAND-type flash memory shown in FIG. 2 taken along the line A-A'.
Figure 2:
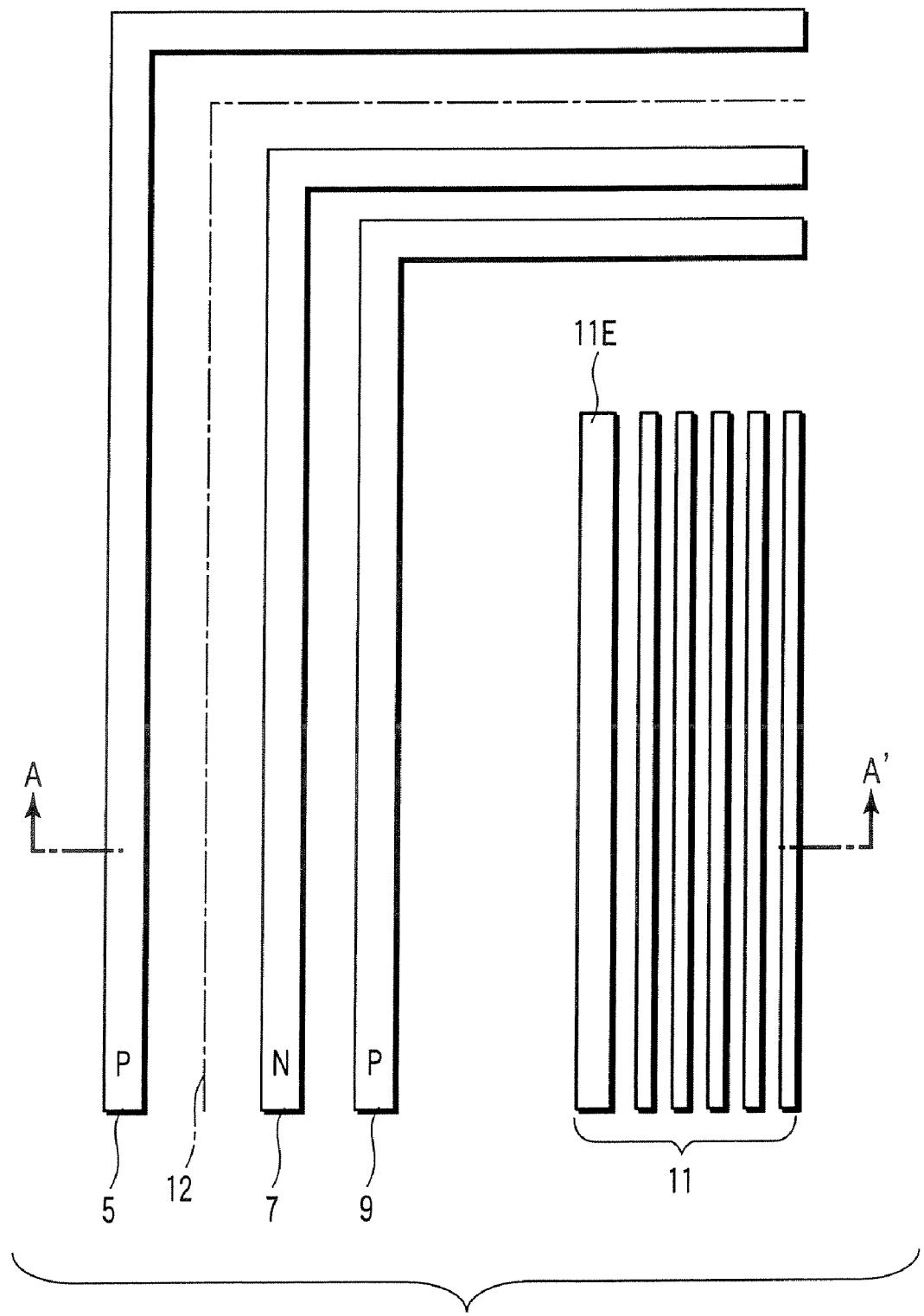
FIG. 2 is a plan view showing in an enlarged manner a part of a memory cell section of the NAND-type flash memory shown in FIG. 1.

FIG. 1 is a plan view of a NAND-type flash memory according to a first embodiment of the present invention. FIG. 2 is a plan view showing in an enlarged manner a part of a memory cell region of the NAND-type flash memory shown in FIG. 1. FIG. 3 is a sectional view of the NAND-type flash memory shown in FIG. 2 taken along the line A-A'.

In FIGS. 1 to 3, reference numeral 1 denotes a P-type silicon substrate (wafer); 2 denotes a sense amplifier area; 3 denotes a row decoder area; 4 denotes a memory cell region; 8 denotes a P-type well diffusion layer (P-well) provided on the surface of the P-type silicon substrate 1 at the outer periphery of the memory cell region 4; 9 denotes a band-shaped P-type guard ring provided on the surface of the P-well 8; 6 denotes an N-type well diffusion layer (N-well) provided on the surface of the P-type silicon substrate 1 at the outer periphery of the P-well 8; 7 denotes a band-shaped N-type guard ring provided on the surface of the N-type well 6; 10, 10' each denote an isolation region; 11 denotes a memory cell array in the memory cell region 4; 11E denotes a memory cell array edge; and 12 denotes a band-shaped boundary area used during double exposure, which is set on the isolation region (STI) 10' between the P-type guard ring 5 and the N-type guard ring 7. The isolation region 10' is a band-shaped isolation region (well isolation region) 10' formed at the outer periphery of the memory cell region 4 for isolating the wells 6 and 8 from the substrate 1.

Figure 4:
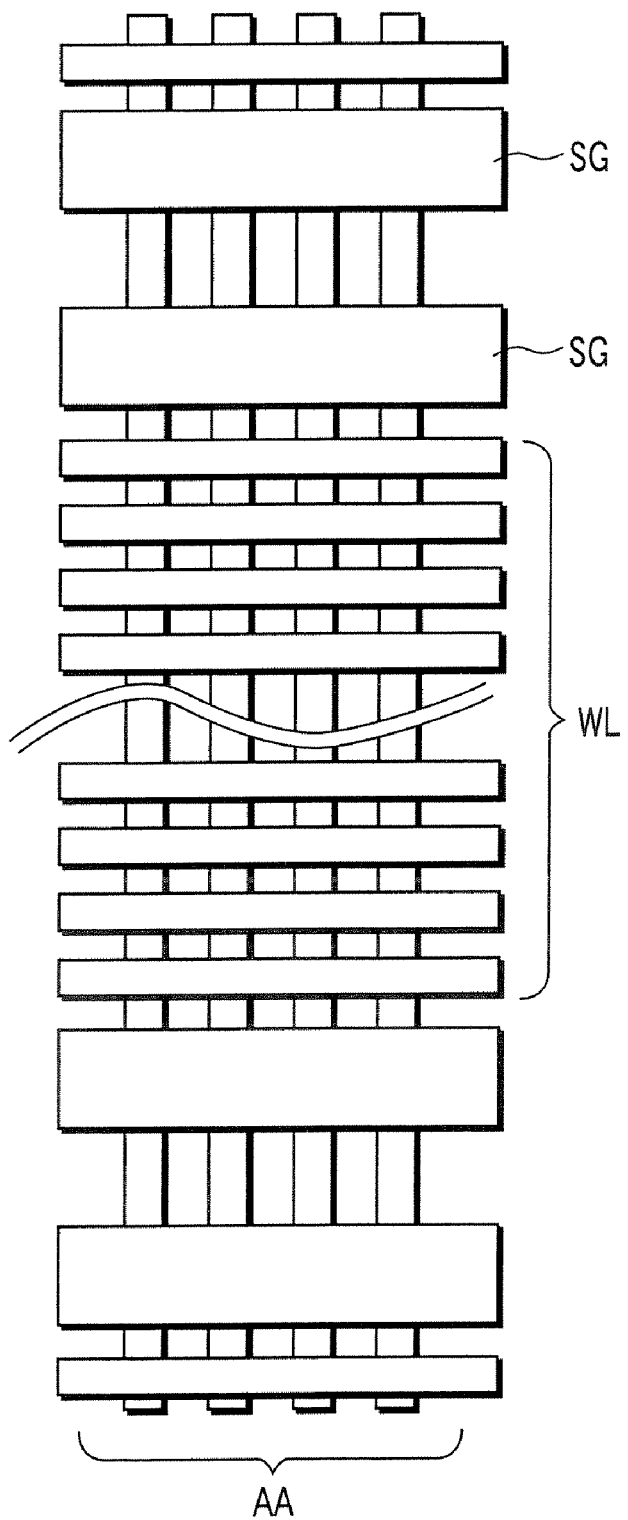
FIG. 4 is a plan view of a plan view of the memory cell section of the NAND-type flash memory shown in FIG. 1.

FIG. 4 is a plan view of the memory cell section of the NAND-type flash memory shown in FIG. 1. In FIG. 4, reference symbol SG denotes a selection gate, WL denotes a word line (gate electrode), and AA denotes an active area.

In the present embodiment, in a patterning (lithography) process for forming an active area forming layer (active area and isolation region), the double exposure boundary area 12 is set on the band-shaped well isolation region 10' formed at the outer periphery of the memory cell region 4. The width of the band of the well isolation region 10' is, for example, a few microns or less. The boundary area 12 is formed in a band shape, and the width of the band is, for example, a few microns or less.

The word line (gate electrode) WL is not connected to a circuit incorporated in the peripheral circuit region without interposing a contact and any other wiring layer at the outer periphery of the memory cell region. In addition, at the inside of the band-shaped well isolation region 10', the word line (gate electrode) WL is arranged in the same direction.

The NAND-type flash memory has a double well structure because it is necessary to supply a high voltage to a substrate incorporated in a memory cell. In the case of the present embodiment, the double well structure comprises the N-well 6 and the P-well 8.

In the present embodiment, as described above, the double exposure boundary area 12 is set on the band-shaped well isolation region 10' for isolating the double well structure. Thereby, it becomes possible to prevent the peripheral circuit section from being influenced by the step of exposing the memory cell section, and, in turn, to prevent the memory cell section from being influenced by the step of exposing the peripheral circuit section. The reason is as follows.

The pattern in the memory cell section is a fine pattern whose minimum processing dimension is, for example, 100 nm or less (specifically, 70 nm or less or 50 nm or less). In this case, the dimension of the pattern in the peripheral circuit section is greater than the minimum processing dimension, but a slightly fine pattern is formed. For example, in the case where the minimum processing dimension is 70 nm or less or 50 nm or less, the above pattern is on the order of 100 nm, and the width of the well isolation region 10' is on the order of a few microns in pattern.

Thus, even when the pattern of the memory cell section is a microfabricated pattern whose dimension is 100 nm or less and the pattern of the peripheral circuit section is greater than the microfabricated pattern, but a fine pattern of the order of 100 nm, the well isolation region 10' is often of a pattern size of the order of a few microns. For this reason, even if the position of the boundary area 12 is shifted on the order of 100 nm on the well isolation region 10' at the time of double exposure, the irradiation position of exposure light or leakage light is set on the well isolation region 10, and thus, is hardly influenced by the displacement of the boundary area 12.

Further, even if exposure light is not irradiated onto the boundary area 12, a pattern (excluding dummy pattern) is not formed on the well isolation region 10' or the guard rings 5, 7 and 9 in the step of forming an active area, and thus, no problem occurs.

Accordingly, the present embodiment can provide a NAND-type flash memory that can be downsized using double exposure, and a method for manufacturing the memory.

While, in the present embodiment, the boundary area 12 is set on the isolation region between the N-type guard ring 7 and the P-type guard ring 5, the boundary area 12 may be set on the isolation region between the P-type guard ring 9 and the N-type guard ring 7. Further, the boundary area 12 may be set on an area between the P-type guard ring 9 and the memory cell array 11 or on an area outside of the P-type guard ring 5.

While, in the present embodiment, the guard rings 5, 7 and 9 is formed in a band shape, namely, in a closed shape, they may be formed in an open shape with part of the band cut.

FIGS. 25A to 25F each show an example of a process for setting a double exposure boundary area on the isolation region (STI) between the guard rings. This process is carried out in the case where a boundary area is set on an area between the P-type guard ring 9 and the N-type guard ring 7.

Figure 25A:
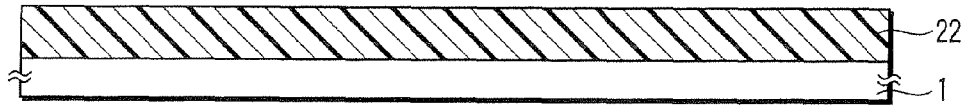
FIGS. 25A to 25F are sectional views each showing an example of a process in the case where a boundary area is set between guard rings.

First, as shown in FIG. 25A, a resist film 22 is formed on the substrate 1. The N-well 6 and P-well 8 in the substrate 1 are not shown here.

Figure 25B:
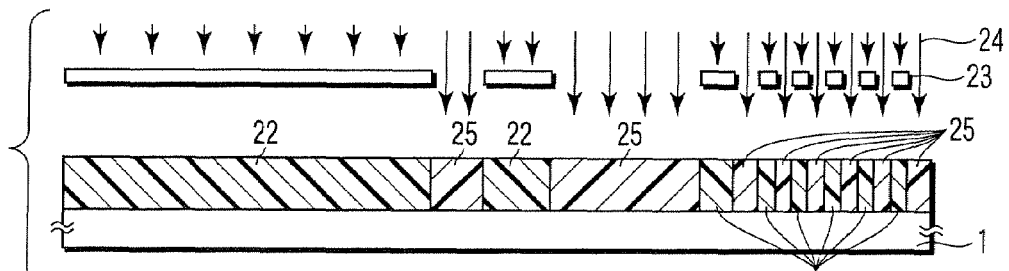

Next, as shown in FIG. 25B, a mask 23 for forming a pattern of the memory cell section is arranged above the substrate 1, the resist film 22 is irradiated with exposure light 24 via the mask 23, and a latent image 25 is formed in the resist film 22.

Figure 25C:
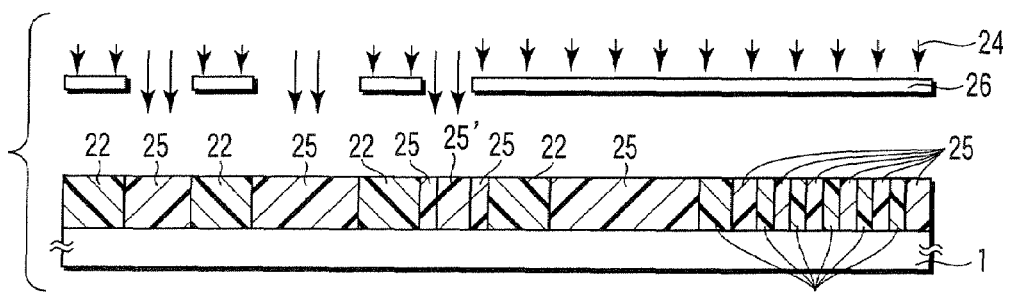

Next, as shown in FIG. 25C, a mask 26 for forming a pattern of the peripheral circuit section is arranged above the substrate 1, the resist film 22 is irradiated with exposure light 24 via the mask 26, and a latent image 25 is formed in the resist film 22.

Here, in order to eliminate misalignment of the masks 23 and 26, a portion of the resist film 22 corresponding to the boundary area is exposed in the steps of FIGS. 25B and 25C. The latent images produced by these two exposures are designated by reference numeral 25' in the figure.

Figure 25D:
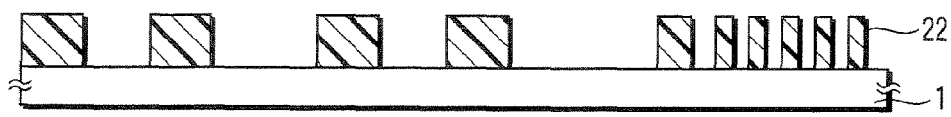

Next, as shown in FIG. 25D, a latent image portion is removed by developing process to form the resist pattern 22.

Figure 25E:
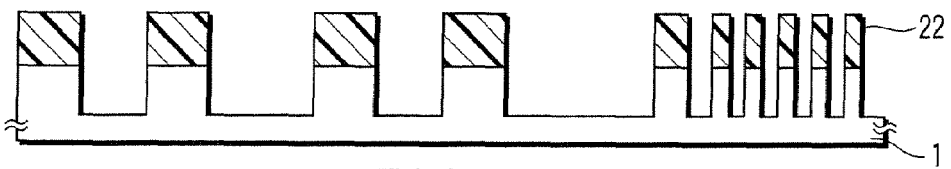

Next, as shown in FIG. 25E, an isolation trench is formed by etching the surface of the substrate with the resist pattern 22 as a mask.

Figure 25F:
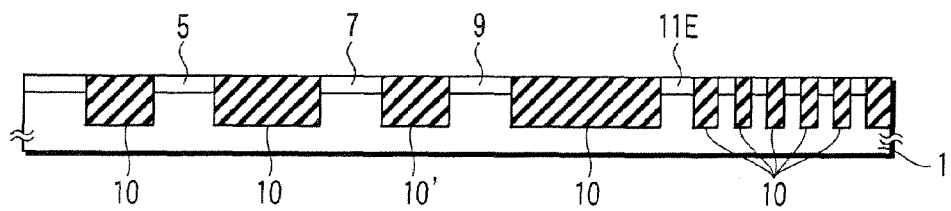

Next, as shown in FIG. 25F, the resist pattern 22 is removed, thereafter, the isolation regions 10 and 10' are formed in accordance with a well-known STI process. Further, the P-type guard ring 5, N-type guard ring 7, and P-type guard ring 9 are formed using well-known ion implantation and annealing.

Second Embodiment

Figure 5:
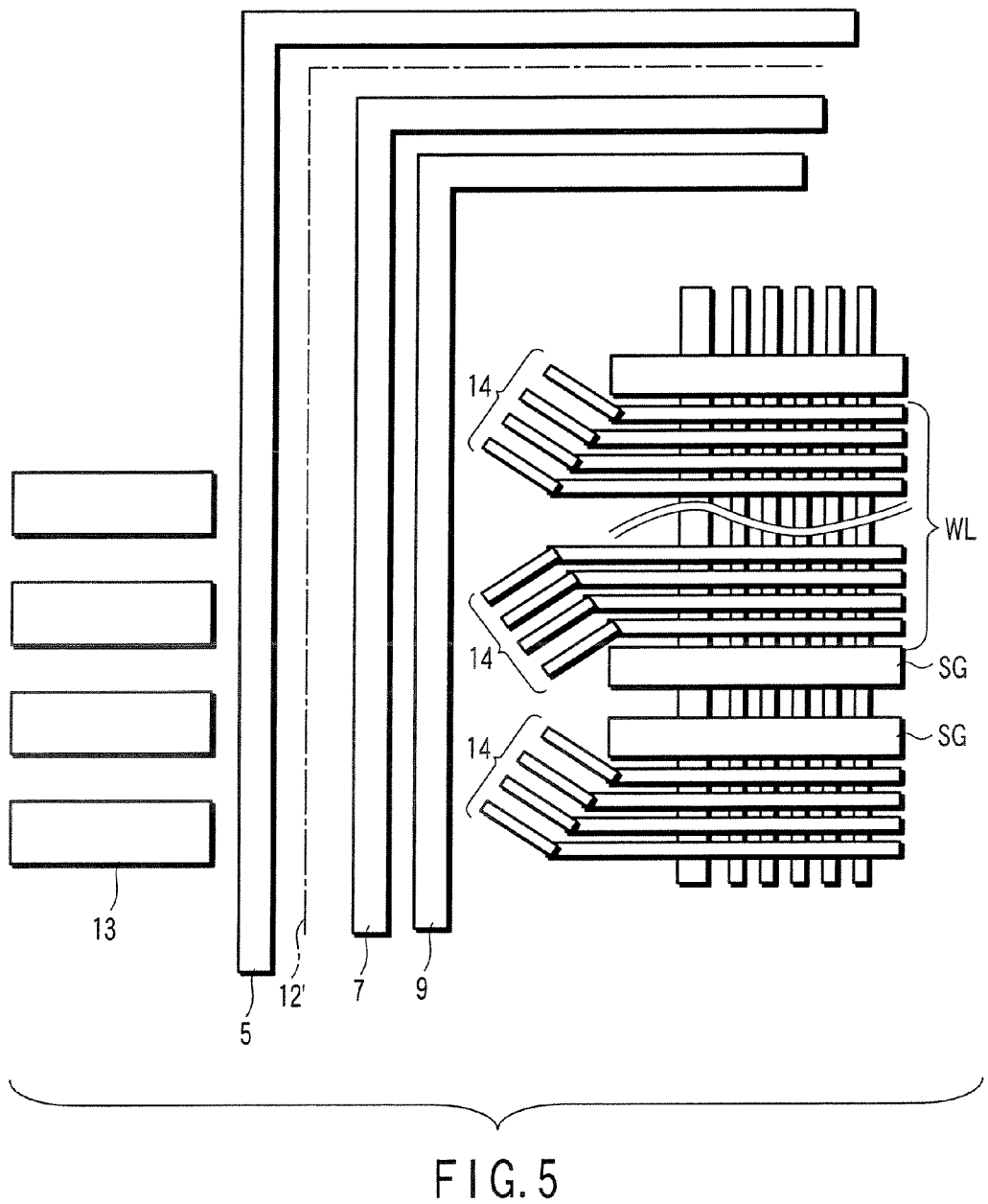
FIG. 5 is a sectional view of a NAND-type flash memory according to a second embodiment of the present invention.

FIG. 5 is a plan view of a NAND-type flash memory according to a second embodiment of the present invention. FIG. 5 is equivalent to the plan view of FIG. 3 according to the first embodiment. In FIG. 5, reference numeral 13 denotes a gate electrode of a peripheral circuit section, and 14 denotes a word line leading section (leading wiring). In FIG. 5, portions corresponding to those shown in FIGS. 1 to 4 (previously shown) are designated by same reference numerals shown in FIGS. 1 to 4 (previously shown), and a detailed description thereof is omitted (this also applies to the following figures.).

The present embodiment describes how to set a boundary area for realizing a gate electrode forming layer which is an upper layer of the active area forming layer (active area and isolation region) defined in the first embodiment by double exposure.

In the NAND-type flash memory, major CG layers of the memory cell section are selection gate electrode CG and word line WL. The word line WL is lead to an external terminal of a memory cell section by the leading wiring 14.

In the present embodiment, a well isolation region for isolating a double well structure and a substrate is provided at the outside of the above terminal, and a layout is determined on the well isolation region such that the leading wiring 14 does not cross.

In such a layout, a band-shaped boundary area 12' for realizing a gate electrode forming layer by double exposure is set in an area above the well isolation region. The width of the band of the boundary area 12' is a few microns or less.

Like the active area forming layer, the pattern in the memory cell in the gate electrode forming layer is a microfabricated pattern whose minimum processing dimension is, for example, 100 nm or less, and the pattern of the peripheral circuit section is a slightly fine pattern whose dimension is on the order of 100 nm, for example.

Therefore, by setting the boundary area 12' as described above, the peripheral circuit section is prevented from being influenced by the step of exposing the memory cell section, and in turn, the memory cell section is prevented from being influenced by the step of exposing the peripheral circuit section, consequently, it is possible to provide a NAND-type flash memory that can be downsized using double exposure and a method for manufacturing the memory as in the first embodiment.

Third Embodiment

FIGS. 6 to 14 are sectional views each showing process for manufacturing a NAND-type flash memory according to a third embodiment of the present invention.

The present embodiment describes a manufacturing process in which a double exposure boundary area is set on a guard ring.

Processes for manufacturing memory cells include a process for forming a dummy gate insulation film on a semiconductor substrate and a process for forming no dummy gate insulation film. Here, the latter process for forming no dummy gate insulation film will be described.

Figure 6:
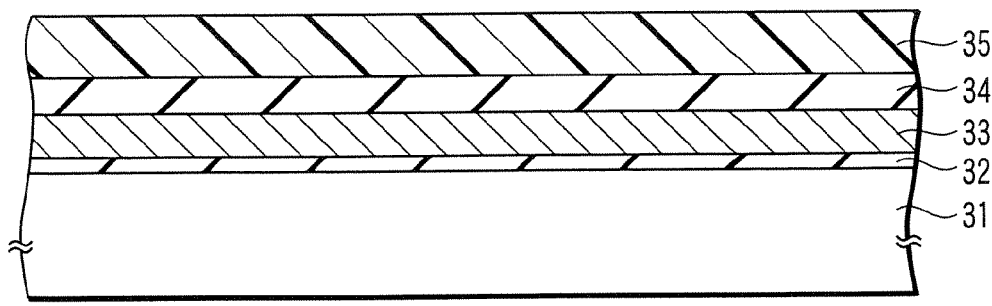
FIG. 6 is a sectional view showing a manufacturing process of a NAND-type flash memory according to a third embodiment of the present invention.

First, as shown in FIG. 6, a gate insulation film 32 is formed on a semiconductor substrate 31, a first conductive film 33 serving as a first gate electrode is formed on the gate insulation film 32, a mask processing material 34 is formed on the first conductive film 33, and further, a photo resist film 35 is formed on the mask processing material 34.

The semiconductor substrate 31 is, for example, a silicon substrate, an SOI substrate, or a substrate containing a semiconductor material other than Si such as SiGe. While the gate insulation film 32 is typically a thermal oxidation film ($SiO_2$ film), it may be an insulation film containing a material with a higher dielectric than $SiO_2$. The first conductive film 33 is, for example, a polycrystalline silicon film containing a dopant or is a metal film. The mask processing material 34 is, for example, a silicon nitride film, a silicon oxide film, an organic film, or a laminate film including at least two of these films.

Figure 7:
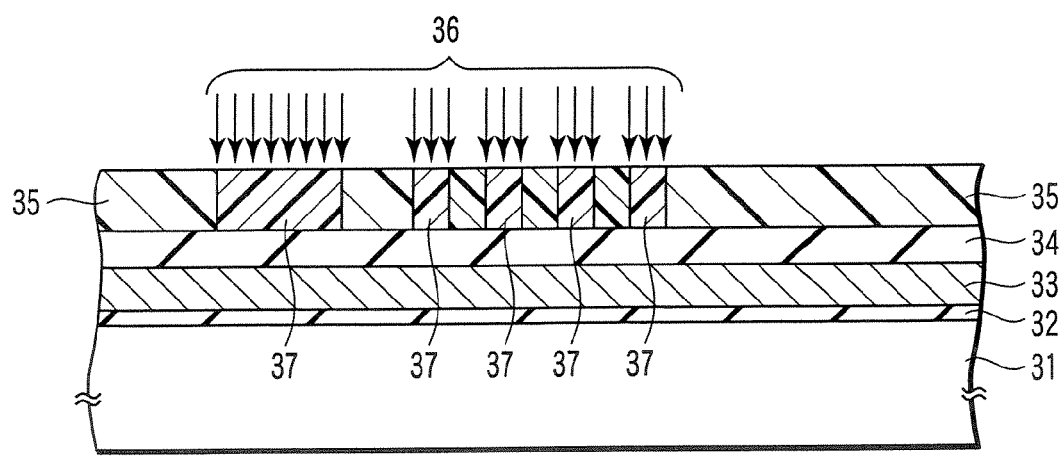
FIG. 7 is a cross-sectional view showing manufacturing process of the NAND-type flash memory of the third embodiment following FIG. 6.

Next, using a first photo mask (not shown) as a light-shielding for a peripheral circuit region, as shown in FIG. 7, the photo resist film 35 on a memory cell region is selectively exposed (first exposure). As a result, a latent image 37 of a pattern of a memory cell section is formed in the photo resist film 35. In FIG. 7, reference numeral 36 denotes first exposure light having passed through the above first photo mask. In FIG. 7, only five latent images 37 (four active areas configuring memory cell array) are shown for the sake of simplification.

While an exposure apparatus used in the first exposure can form a pattern (first pattern) in the memory cell section, the pattern in the memory cell section and a pattern (second pattern) in the peripheral circuit section cannot be formed at the same time (for example, an exposure apparatus using double pole illumination as resolution enhancement techniques).

In comparison between the first pattern and the second pattern, they are different from each other as described in items (1) to (5):

(1) The first pattern has periodicity and the second pattern has non-periodicity.
(2) An iso/dense ratio (Line/Space ratio) of the first pattern is approximately 1:1, whereas an iso/dense ratio (Line/Space ratio) of the second pattern is 1:1 to 1:10 or more.
(3) The direction of the first pattern is limited (fixed direction), whereas the direction of the second pattern is not limited (vertical direction, horizontal direction, oblique direction or the like can be defined).
(4) The first pattern is formed in accordance with an ultra-fine design rule (for example, 50 nm rule), whereas the second pattern is formed in a quasi-fine design rule (for example, 100 nm rule).
(5) The first pattern is formed inside of the double well structure, whereas the second pattern is formed outside of the double well structure.

Figure 8:
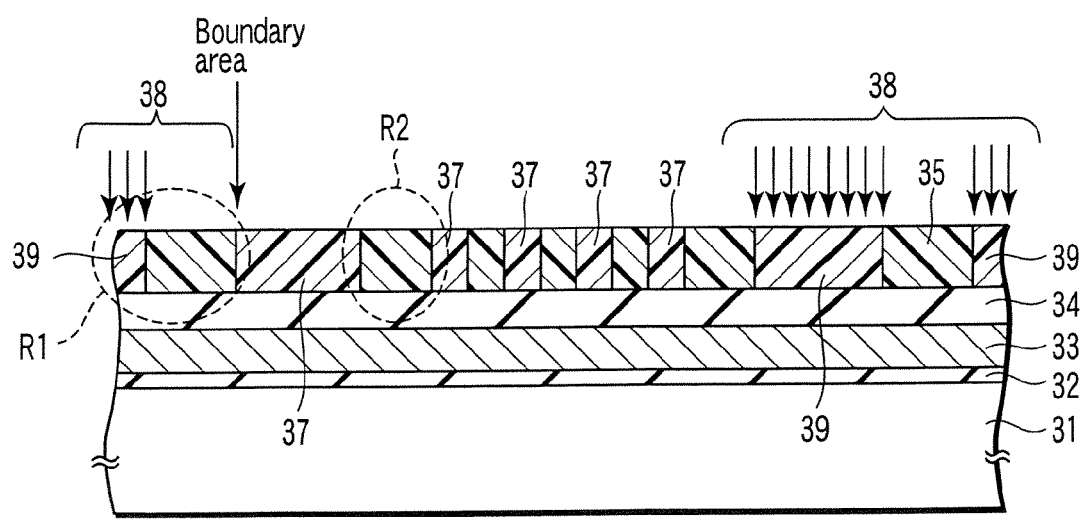
FIG. 8 is a cross-sectional view showing manufacturing process of the NAND-type flash memory of the third embodiment following FIG. 7.

Next, using a second photo mask (not shown) as a light-shielding for a memory cell region, the photo resist film 35 on the peripheral circuit region is selectively exposed by exposure light as shown in FIG. 8 (second exposure). As a result, a latent image 39 of a pattern of the peripheral circuit section is formed in the photo resist film 35. In FIG. 8, reference numeral 38 denotes second exposure light having passed through the above second photo mask.

Here, in the first and second exposures of FIGS. 7 and 8, namely, in double exposure (in the step of forming an active area forming layer), the double-exposure boundary area is set on a guard ring (equivalent to the P-type guard ring 9 of the first embodiment). In FIG. 8, R1 denotes an area of the above guard ring, and R2 denotes an area of a pattern of a memory cell array end. The pattern of the memory cell array end is slightly thick as compared with that in another area of the memory cell array. Setting the double-exposure boundary area as described above makes it possible to prevent the memory cell region from being influenced by the first exposure (exposure of the memory cell region), and in turn, to prevent the memory cell region from being influenced by the second exposure (exposure of the peripheral circuit region).

The exposure apparatus used in the second exposure is in accordance with a system (for example, multiple pole illumination) with a lower resolution (NA: numeric aperture of lens in exposure apparatus) and a higher resolution of a random pattern as compared with those of the exposure apparatus used in the first exposure.

Here, the exposure apparatus used in the first and second exposures may be identical to or may be different from each other. In the former case, for example, these exposure apparatus each comprises a structure capable of switching a light source or a lens, and the light sources or lenses used in the first and second exposures are optimally set.

Figure 9:
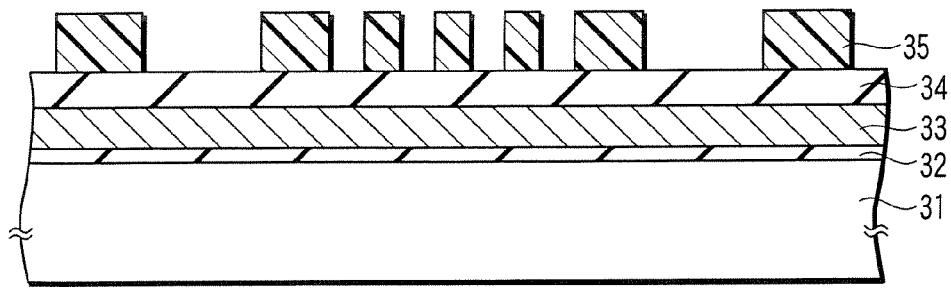
FIG. 9 is a cross-sectional view showing manufacturing process of the NAND-type flash memory of the third embodiment following FIG. 8.

Next, the photo resist film 35 is developed, as shown in FIG. 9, a photo resist film (resist pattern) 35 including an open pattern corresponding to patterns of the memory cell section and the peripheral circuit section is formed.

Next, the mask processing material 34 is etched with the resist pattern 35 as a mask. As a result, a pattern of the resist pattern 35 is transferred onto the mask processing material 34.

Figure 10:
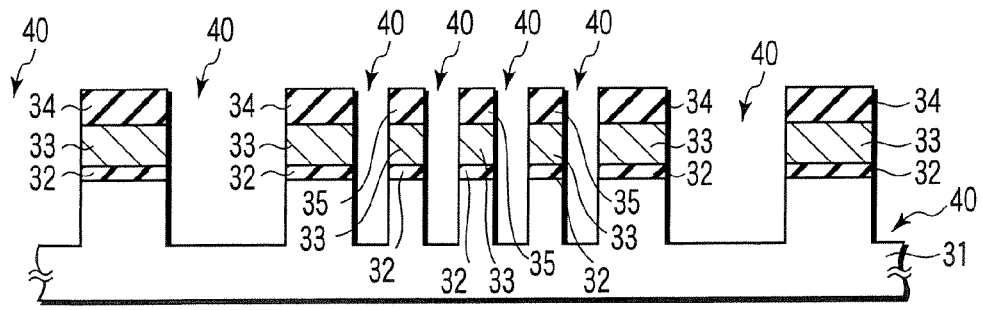
FIG. 10 is a cross-sectional view showing manufacturing process of the NAND-type flash memory of the third embodiment following FIG. 9.

After the pattern of the resist pattern 35 is transferred onto the mask processing material 34, an underlying layer (first conductive film 33, gate insulation film 32, and semiconductor substrate 31) is etched with the resist pattern 35 and the mask processing material 34 as masks. At this time, the resist pattern 35 is eliminated partway, thereafter, the etching using the mask processing material 34 as a mask is proceeded. As a result, as shown in FIG. 10, an isolation trench 40 is formed. As the isolation trench 40 is formed, an active area is defined.

Figure 11:
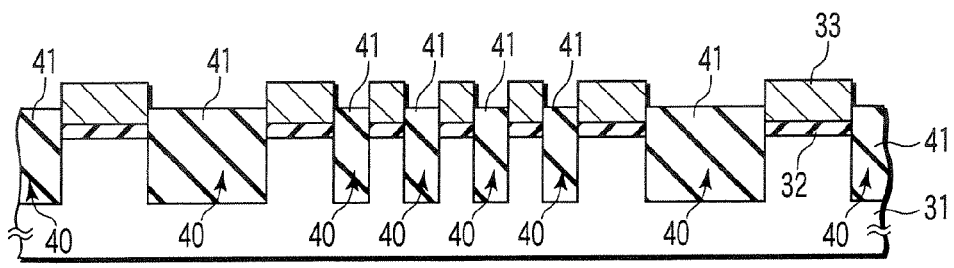
FIG. 11 is a cross-sectional view showing manufacturing process of the NAND-type flash memory of the third embodiment following FIG. 10.

Next, the mask processing material 34 is removed, thereafter, an isolation film (for example, $SiO_2$ film: silicon oxide film) is formed on the entire surface such that the isolation trench 40 is filled. Further, an unnecessary isolation film is removed by flattening process (for example, chemical mechanical polishing (CMP)), as shown in FIG. 11, an isolation region is formed such that the isolation trench 40 is filled with the isolation film 41. Such isolation is referred to as STI (shallow trench isolation).

As in the present embodiment, when the gate insulation film 32 and the first conductive film 33 are formed in advance, the isolation region is formed in a self-aligned manner.

Figure 12:
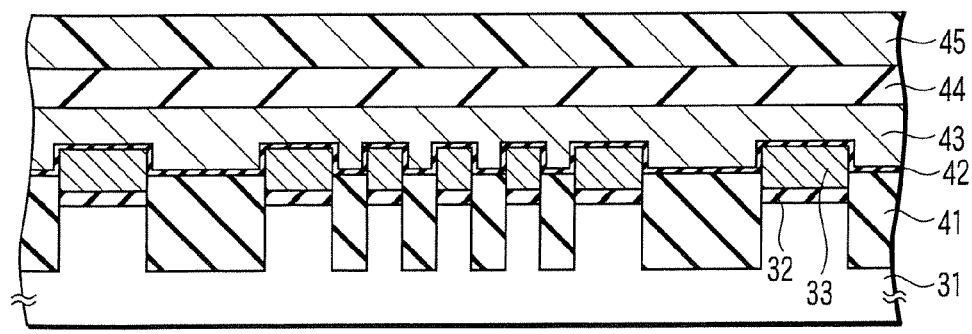
FIG. 12 is a cross-sectional view showing manufacturing process of the NAND-type flash memory of the third embodiment following FIG. 11.

Next, as shown in FIG. 12, an inter-gate insulation film 42 is formed on the entire surface, a second conductive film 43 serving as a second gate electrode is formed on the inter-gate insulation film 42 a mask processing material 44 is formed on the second conductive film 43 and further, a photo resist film 45 is formed on the mask processing material 44. The mask processing material 44 and the photo resist film 45 each serve as a mask for etching the second conductive film 43.

The second conductive film 43 is a polycrystalline silicon film containing a dopant or is a metal film. The mask processing material 44 is, for example, a silicon nitride film, a silicon oxide film, an organic film, or a laminate film including at least two of these films.

The inter-gate insulation film 42 is a silicon oxide film ($SiO_2$ film), a monolayer film composed of a silicon nitride film (SiN film) or a silicon acid nitride film (SiON film), or a laminate film including at least two of these insulation films (including a laminate film of three or more layers including identical insulation films (for example, SiON film/SiN film/SiON film)). The inter-gate insulation film 42 is further an aluminum oxide film, an aluminum nitride film, an aluminum oxide/nitride film, a monolayer film composed of a hafnium oxide film or a hafnium oxide/nitride film, a laminate film including at least two of these insulation films (including a laminate film of three or more layers including identical insulation films), or an insulation film including at least one of these insulation films and at least one of a $SiO_2$ film, a SiN film and a SiON film.

Next, like double exposure for forming the isolation regions of FIGS. 7 and 8, the photo resist film 45 on a memory cell region is selectively exposed using a photo mask as a light-shielding for a peripheral circuit region. Subsequently, the photo resist film 45 on the peripheral circuit region is selectively exposed using a photo mask as a light-shielding for the memory cell region. As a consequence, latent images of patterns of the memory cell section and the peripheral circuit section are formed in the photo resist film 45.

Here, a double exposure boundary area is set on a guard ring (not shown) at the time of carrying out double exposure of the photo resist film 45 (the step of forming a gate electrode forming layer). This makes it possible to prevent the memory cell section from being influenced by the step of exposing the memory cell region and, in turn, to prevent the memory cell section from being influenced by the step of exposing the peripheral circuit region.

Next, the photo resist film 45 is developed, as shown in FIG. 13, a photo resist film (resist pattern) 45 including an open pattern corresponding to a pattern of the memory cell section and an open pattern corresponding to a pattern of the peripheral circuit section (not shown) is formed.

Next, as in the etching step of FIG. 10, an underlying layer (first conductive film 33 and second conductive film 43) is etched using the resist pattern 45 and the mask processing material 44 as masks. As a result, as shown in FIG. 14, the first gate electrode 33 and the second gate electrode 34 are formed. In the memory cells, the first gate electrode 33 is a floating gate electrode and the second gate electrode is a control gate electrode.

Next, the mask processing material 44 is removed, thereafter, a NAND-type flash memory is completed by performing the well-known steps such as a step of forming source/drain regions, a step of forming an interlayer insulation film, a step of forming a contact hole reaching to the second gate electrode 43 and the source/drain regions in the interlayer insulation film, a step of forming a contact electrode in the contact hole, and a step of forming a metal wiring layer on the contact electrode.

The above metal wiring layer is, for example, a multilayer metal wiring layer such as a three-layer metal wiring layer. In the case of the three-layer metal wiring layer, for example, a second metal wiring layer is a bit line (BL). A material (wiring material) for each of the wiring layers of the multilayer metal wiring layer is W (tungsten), Al (aluminum), Cu (copper), or a mixture of Al and Cu.

Depending on the wiring material, a barrier metal layer may be provided on at least one of a lower part, an upper part, and a side part of each wiring layer.

The barrier metal layer is, for example, a Ti (Titanium) film, a TiN (Titanium nitride) film, a monolayer film composed of a Ta (Tantalum) film or a TaN (Tantalum nitride) film, or a laminate film including at least two or more films selected from among these films.

A wiring and contact plug under the wiring may be the same wiring material formed at the same time (dual Damascene wiring).

In some cases, a wiring and contact plug under the wiring are formed of different wiring materials (Damascene wiring). For example, when the contact plug on the first metal wiring is a W plug and the second metal wiring layer is a Cu bit wiring, the associated process is as follows.

First, the W plug on the first metal wiring is formed, and then, an interlayer insulation film is formed on the entire surface. The interlayer insulation film may be or may not be functioned as a mask processing material. In the latter case, a mask processing material (for example, a silicon nitride film, a silicon oxide film, an organic film, or a laminate film including at least two of these films or the like is used.) is formed on the interlayer insulation film. Now, a description will be continued below, assuming that the interlayer insulation film functions as a mask processing material.

A photo resist film is formed on the interlayer insulation film, thereafter, the photo resist film is subjected to exposure and development to form a resist pattern. The resist pattern includes an opening corresponding to the wiring.

Next, the interlayer insulation film is etched with the resist pattern as a mask. As a result, a wiring trench is formed on the surface of the interlayer insulation film.

Next, barrier metal film is formed on a bottom face and a side face of the wiring trench.

And then, a Cu film is formed on the entire surface such that the inside of the wiring trench is filled, further, with a CMP process, the Cu film outside of the wiring trench is removed and the surface is planarized to complete a Cu bit wiring (Damascene wiring).

An Al film or a W film may be used instead of the Cu film. In the case of these conductive films, a so-called RIE wiring may be used instead of the Damascene wiring.

As has been described above, the present embodiment provides the following advantages. That is, setting the double-exposure boundary area in the step of forming the active area forming layer and a gate electrode forming layer on a guard ring makes it possible to prevent the memory cell section from being influenced by the step of exposing the memory cell region and, in turn, to prevent the memory cell section from being influenced by the step of exposing the peripheral circuit region. Consequently, it is possible to provide the NAND-type flash memory that can be downsized using double exposure and the method for manufacturing the memory. The guard ring on which the double exposure boundary area is set in the step of forming the active area forming layer and the guard ring on which the double exposure boundary area is set in the step of forming the gate electrode forming layer may be identical or different from each other.

Here, a description has been given with respect to a case where the double exposure boundary areas in the steps of forming the active area forming layer and the gate electrode forming layer are set on the guard ring, however, these boundary areas in the above steps may be set on the boundary areas 12 and 12' in the first and second embodiments, respectively.

Fourth Embodiment

FIGS. 15 to 24 are sectional views each showing process for manufacturing a NAND-type flash memory according to a fourth embodiment of the present invention.

The manufacturing method according to the fourth embodiment is a method for forming a gate (such as a gate insulation film 32, gate electrode, or the like) after forming an isolation region, and includes a step of forming a dummy gate insulation film on a semiconductor substrate.

First, as shown in FIG. 15, a dummy gate insulation film 32d, a mask processing material 34, and a photo resist film 35 are sequentially formed on a semiconductor substrate 31.

Next, using a first photo mask (not shown) as a light-shielding for a peripheral circuit region, as shown in FIG. 16, the photo resist film 35 on a memory cell region is selectively exposed (first exposure), thereby, a latent image 37 of a pattern of a memory cell section is formed in the photo resist film 35. In FIG. 16, reference numeral 36 denotes a first exposure light having passed through the first photo mask.

Next, using a second photo mask (not shown) as a light-shielding for the memory cell region, as shown in FIG. 17, the photo resist film 35 on the peripheral circuit region is selectively exposed (second exposure), thereby, a latent image 39 of a pattern of the peripheral circuit section is formed in the photo resist film 35. In FIG. 17, reference numeral 38 denotes a second exposure light having passed through the second photo mask.

Here, at the time of carrying out the first and second exposures of FIGS. 16 and 17, namely, double exposure (the step of forming the active area forming layer), the double-exposure boundary area is set on the guard ring described in the third embodiment. This makes it possible to prevent the memory cell region from being influenced by the first exposure (exposure of the memory cell region) and, in turn, to prevent the memory cell region from being influenced by the second exposure (exposure of the peripheral circuit region).

Next, the photo resist film 35 is developed, as shown in FIG. 18, a photo resist film (resist pattern) 35 including opened patterns corresponding to patterns of the memory cell section and the peripheral circuit section is formed.

Next, the mask processing material 34 is etched with the resist pattern 35 as a mask. As a result, a pattern of the resist pattern 35 is transferred onto the mask processing material 34.

After the pattern of the resist pattern 35 is transferred onto the mask processing material 34, an underlying layer (here, dummy gate insulation film 32d and semiconductor substrate 31) is etched with the resist pattern 35 and the mask processing material 34 as masks. At this time, the resist pattern 35 is eliminated partway, thereafter, the etching using the mask processing material 34 as a mask proceeds. As a result, as shown in FIG. 19, an isolation trench 40 is formed. As the isolation trench 40 is formed, the active area is defined.

Next, the dummy gate insulation film 32d is removed, thereafter, as shown in FIG. 20, the gate insulation film 32 is formed, subsequently, an isolation film is formed on the entire surface such that the isolation trench 40 is filled, further, with planarization process (for example, CMP), unnecessary isolation insulation film is removed and planarized, thereby, an isolation region comprising the isolation film 41 which fills the isolation trench 40 is formed.

Figure 21:
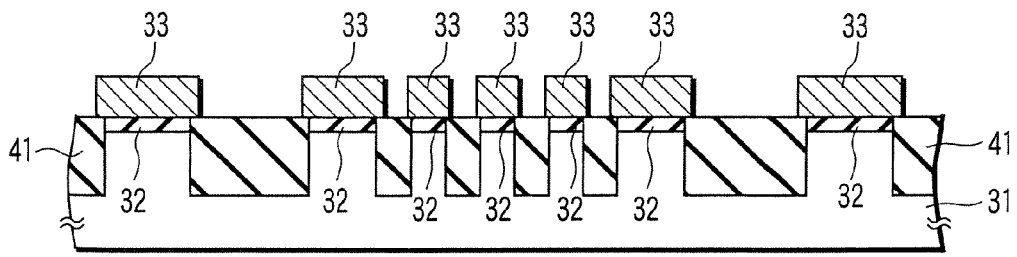
FIG. 21 is a cross-sectional view showing manufacturing process of the NAND-type flash memory of the fourth embodiment following FIG. 20.

Next, as shown in FIG. 21, a first gate electrode is formed on the gate insulation film 32.

The process for forming the first gate electrode 33 includes a step of forming a first conductive film serving as the first gate electrode 33, a step of forming a mask processing material on the first conductive film, a step of forming a photo resist film on the mask processing material, a step of selectively exposing a photo resist film on a memory cell region using a photo mask as a light-shielding for the peripheral circuit region, a step of developing the photo resist film to form a resist patter, and a step of etching the first conductive film on a memory cell region with the resist pattern as a mask.

In the present embodiment, the first conductive film on the peripheral circuit region is not removed.

Figure 22:
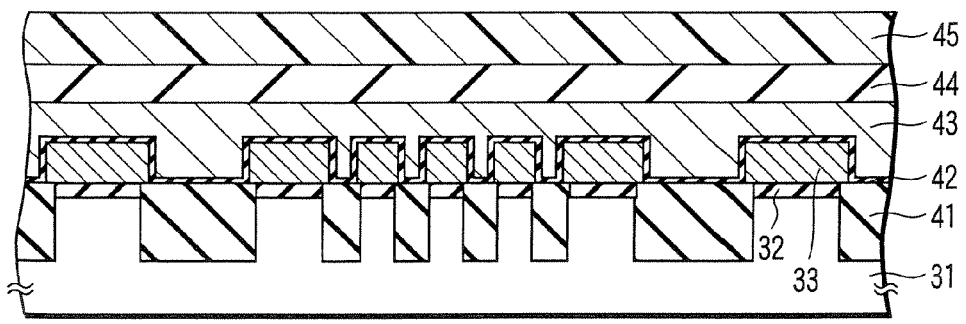
FIG. 22 is a cross-sectional view showing manufacturing process of the NAND-type flash memory of the fourth embodiment following FIG. 21.

As shown in FIG. 22, an inter-gate insulation film 42 is formed on the entire surface, subsequently, a second conductive film 43 serving as a second gate electrode is formed on the inter-gate insulation film 42, further, a mask processing material 44 and a photo resist film 45 are sequentially formed on the second conductive film 43.

Next, like double exposure for forming the isolation regions of FIGS. 16 and 17, the photo resist film 45 on the memory cell region is selectively exposed using a photo mask as a light-shielding for the peripheral circuit region, and subsequently, the photo resist film 45 on the peripheral circuit region is selectively exposed using a photo mask as a light-shielding for the memory cell region. As a result, latent images of patterns of the memory cell section and peripheral circuit section are formed on the photo resist film 45.

Figure 23:
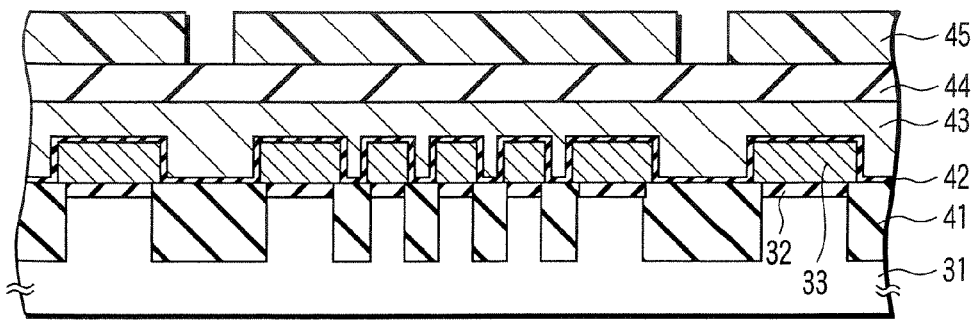
FIG. 23 is a cross-sectional view showing manufacturing process of the NAND-type flash memory of the fourth embodiment following FIG. 22.

Next, the photo resist film 45 is developed, thereby, as shown in FIG. 23, the photo resist film (resist pattern) 45 including an open pattern corresponding to a pattern of the memory cell section and an open pattern corresponding to a pattern of the peripheral circuit section (not shown) is formed.

Figure 24:
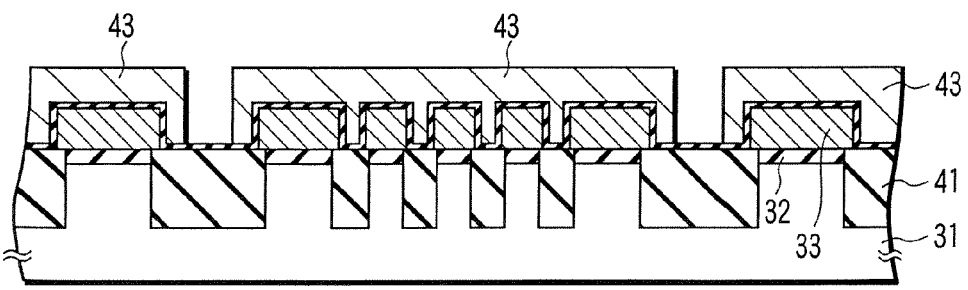
FIG. 24 is a cross-sectional view showing manufacturing process of the NAND-type flash memory of the fourth embodiment following FIG. 23.

Next, like the etching step of FIG. 19, an underlying layer (here, second conductive film 43) is etched using the resist pattern 45 and the mask processing material 44 as masks. As a result, as shown in FIG. 24, the second gate electrode 43 is formed.

Next, the mask processing material 44 is removed, thereafter, a NAND-type flash memory is completed by performing the well-known steps such as a step of forming source/drain regions, a step of forming an interlayer insulation film, a step of forming a contact hole reaching to the second gate electrode 43 and the source/drain regions in the interlayer insulation film, a step of forming a contact electrode in the contact hole, and a step of forming a metal wiring layer on the contact electrode.

The above-described metal wiring layer and matters related thereto are similar to those of the third embodiment.

Here, a description has been given with respect to a case where the double exposure boundary areas in the steps of forming the active area forming layer and the gate electrode forming layer are set on the guard ring, however, these boundary areas in the above steps may be set on the boundary areas 12 and 12' in the first and second embodiments, respectively.

Fifth Embodiment

While the fourth embodiment has been described a case of forming one gate insulation film 32 after removing the dummy gate insulation film 32d, a plurality of gate insulation films may be formed. Hereinafter, a case where there are three insulation films (first to third gate insulation films) will be described.

The film thicknesses of the first to third gate insulation films may be different from or equal to one another or two of the thicknesses are equal to each other.

The example that three gate insulation films all have different thickness is as follows. That is, the first gate insulation film is a gate insulation film which is formed in a memory cell region, the second gate insulation film is a gate insulation film which is formed in a transistor area of a low voltage drive system (Vcc system) of a peripheral circuit region, and the third gate insulation film is a gate insulation film which is formed in a transistor area of a high voltage drive system (Vpp system) having approximately 20V or more of the peripheral circuit region.

The reason why the high voltage drive system of about 20V or more exists is that write/erase of data is performed using FN tunnel phenomenon in NAND-type flash memory.

The film thickness of the first gate insulation film is, for example, 9 nm in effective equivalent oxide thickness, the film thickness of the second gate insulation film is, for example, 15 nm in effective equivalent oxide thickness; and the film thickness of the third gate insulation film is, for example, 40 nm in effective equivalent oxide thickness. In the case of the above-described example, the film thickness of the first gate insulation film in the memory cell region may be equal to that of the second gate insulation film in the transistor area of the Vcc system.

The first to third gate insulation films are formed in order of, for example, the third gate insulation film, the second gate insulation film, and the first gate insulation film. In this case, after forming a dummy gate insulation film 32d and before forming a mask processing material, the third gate insulation film may be formed. Although the first gate insulation film is generally formed lastly, the first gate insulation and the second gate insulation film may be formed in reversed order.

Sixth Embodiment

The fourth and fifth embodiments include the steps 5 of forming the dummy gate insulation film 32d, forming the isolation region (active area), removing the dummy gate insulation film 32d, forming the gate insulation film 32 (plurality of gate insulation films in the case of the fifth embodiment), forming the first conductive film, and forming the first gate electrode 33 by selectively etching the first conductive film on the memory cell region.

As described above, in the fourth and fifth embodiments, the first conductive film on the peripheral circuit region is not removed. The present embodiment describes a method that the first conductive film on the peripheral circuit region is removed.

In the present embodiment, the first conductive film on the periphery circuit region is removed, and at the same time, the first gate electrode 33 is formed on the memory cell region, or the first gate electrode 33 is formed on the memory cell region after the first conductive film on the peripheral circuit region is removed.

Thereafter, an inter-gate insulation film 42 is formed on the entire surface, a second conductive film 43 is formed on the inter-gate insulation film 42, a mask processing material is formed on the second conductive film 43, a resist film is formed on the mask processing material, the resist film is subjected to double exposure and development to form a resist pattern, and the second gate electrode 43 is formed by etching the second conductive film 43 using the resist pattern and the mask processing material to which the pattern of the resist pattern is transferred as masks.

In this case, while the memory cell section is a multilayer gate electrode having the first gate electrode 33, the inter-gate insulation film 42 and the second gate electrode 43 formed on the gate insulation film 43, the peripheral circuit section is a monolayer gate electrode including only the second gate electrode 43 formed on the gate insulation film 42.

As the gate electrode of the peripheral circuit section is provided in the form of monolayer gate electrode, the conductivity types of the gate electrodes of n-channel and p-channel MOS transistors of the CMOS circuit of the peripheral circuit section can be as $n^+$ type and $p^+$ type, respectively. That is, a dual surface channel type CMOS circuit (Dual Gate type) is realized so as to achieve high performance of the transistors.

It is also possible to define the conductivity types of the gate electrodes of the n-channel and p-channel MOS transistors of the CMOS circuit of the peripheral circuit section each as an $n^+$ type MOS circuit (Buried PMOS type).

The conductivity types of the first and second gate electrodes of the transistor of the memory cell section are $n^+$ type, and the transistor of the memory cell section is relatively low in density of the source/drain regions than the CMOS circuit of the peripheral circuit section.

In addition, a monolayer gate electrode may be formed only on the gate insulation film 42 in the peripheral circuit section.

Seventh Embodiment

As downsizing processing advances, it becomes necessary to use a mask for improving resolution by utilizing optical phase information, namely, a phase shift mask such as a half tone type in a double exposure.

For example, in the case where a pattern size of 100 nm or less is resolved by an exposure apparatus equipped with a KrF (wavelength 248 nm) or an ArF (wavelength 193 nm), it becomes necessary to use a halftone type phase shift mask comprising a glass substrate (transparent substrate), a halftone section that transmits a part of light, and a light shielding section that does not transmit the light.

The halftone section is provided on an area in which a fine pattern is formed. Material of the halftone section is, for example, MoSi. On the other hand, material of the light shielding section is, for example, Cr. As just described, the phase shift mask is a photo mask that includes a plurality of members made of different materials on the glass substrate.

In the case where deviation of pattern size on the boundary area of the double exposure portion on a wafer has greater influence to pattern formation than deviation in mask manufacturing of the halftone section and the light shielding section on the transparent substrate, double exposure does not come into effect.

Accordingly, for example, the band-shaped well isolation region 10' for separating the N-well 6 and the P-well 8 from each other, on which the double exposure boundary area 12 of the active area forming layer is set, must be set on a area on which leakage light of the double exposure does not reach, and the phase shift mask must be such that the deviation amount in mask manufacturing of an area where light penetrates due to the halftone section and a light shielding area due to the light shielding section is smaller than the width of the band of the well isolation region 10'.

In this case, a robust layout with respect to planarization process or the like is realized by forming dummy cells on outer area of the memory cells raging from the double exposure boundary area 12 to the area which is not influenced by the deviation of the phase shift mask in order to maintain pattern density.

For example, a layout is configured such that a distance from the memory cells to the double exposure boundary area 12 is 3 μm, however, an area from the well isolation region 10' ranging for example 5-μm is set as the dummy cell area so that the area is not used practically from the viewpoints of leakage light and precision of forming the light shielding region of the mask. A control circuit for improving the yield is mounted in the dummy cell, and is utilized as a redundant memory.

The distance from the memory cells to the double exposure boundary area 12 is not limited to 3 μm, and any distance is admissible as long as it is, for example, 10 μm or less.

Eight Embodiment

FIGS. 26A to 26C are sectional views each showing process for manufacturing a NAND-type flash memory according to an eighth embodiment of the present invention. In FIGS. 26A to 26C, portions corresponding to those shown in FIGS. FIGS. 25A to 25F are designated by same reference numerals shown in FIGS. 25A to 25F, and a detailed description thereof is omitted.

In FIGS. 26A to 26C, reference symbols 5r, 7r and 9r denote a forming area of a P-type guard ring 5, a forming area of an N-type guard ring 7, and a forming area of a P-type guard ring 9, respectively, which are formed in the steps that follows the step of FIG. 26C.

First, as shown in FIG. 26A, a resist film 22 is formed on the substrate 1, a mask 23' (first mask) for forming a pattern of a memory cell section is arranged above the substrate 1, the resist film 22 is irradiated with light 24 via the mask 23' (first exposure), and a latent image 25 is formed in the resist film 22.

Next, as shown in FIG. 26B, a mask 26' (second mask) for forming a pattern of a peripheral circuit section is arranged above the substrate 1, the resist film 22 is irradiated with the light 24 via the mask 26' (second exposure), and a latent image 25 is formed in the resist film 22.

Here, the double exposure boundary area is set on the P-type guard ring 9 such that the area of the resist film 22 irradiated with light by the first exposure and the area of the resist film 22 irradiated with light by the second exposure do not overlap each other, therefore, the resist film 22 of a portion corresponding to the boundary area (a portion where light should be shielded) is restrained from being exposed in the steps of FIGS. 26A and 26B. That is, the resist film 22 of the portion corresponding to the boundary area is restrained from being exposed by excessive amount of exposure.

When the resist film 22 is exposed by excessive amount of exposure, there may occur a problem, for example, degraded characteristics of the resist film 22 or degradation of dimensional control properties of the resist pattern. However, according to the present method, the resist film 22 is restrained from being exposed by excessive amount of exposure, so that the problem described above is prevented. Moreover, the dimensions of the guard ring area can be regarded as being sufficiently large as compared with that of a fine rule area, thus, even if characteristic degradation or the like occurs, its influence can be practically ignored.

Next, as shown in FIG. 26C, the latent image portion is removed by development to form a resist pattern 22, thereafter, the steps of FIGS. 25E and 25F described previously are carried out to form the P-type guard ring 5, N-type guard ring 7, and P-type guard ring 9.

Here, the double exposure boundary area is set on the P-type guard ring 9, however, the boundary area may be set on another area as long as the area of the resist film 22 irradiated with light by the first exposure does not overlap the area of the resist film 22 irradiated with light by the second exposure. For example, the double exposure boundary area may be set on another guard ring or on an isolation region between guard rings.

The present invention is not limited to the embodiments described above. For example, while the foregoing embodiments have described a case of NAND-type flash memory, any other memory may be used. Especially, in the case where a memory comprising a complicated pattern whose design rule is slightly loose as compared with that of memory cells is provided at outer area of a dense and large-capacity memory cell section, the similar effect as the above embodiments is obtained by performing double exposure with the boundary area of a few microns as in the embodiments described above While the embodiments have described a case of double exposure, the present invention can also be applied to multiple exposure of triple or more exposure.

In addition, while the embodiments have described a case of setting a double exposure boundary area on an isolation region between guard rings and on each of the guard rings, the boundary area may be set on an area between the guard ring and the memory cell region (in the case where a dummy pattern exists, the boundary area may exist between the dummy pattern and the guard ring.).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, the semiconductor device comprising
   a semiconductor substrate including a memory cell region having a first pattern, a peripheral circuit region having a second pattern being wider than the first pattern, and an interface region located between the memory cell region and the peripheral circuit region,
   a P-type well diffusion layer provided on a surface of the semiconductor substrate and surrounding the memory cell region, an N-type well diffusion layer provided on the surface of the semiconductor substrate and surrounding the P-type well diffusion layer, a first isolation region provided on the surface of the semiconductor substrate in the interface region, the first isolation region located at a first interface portion between the P-type and the N-type well diffusion layers, a second isolation region provided on the surface of the semiconductor substrate in the interface region, the second isolation region located between the first isolation region and the memory cell region, a third isolation region provided on the surface of the semiconductor substrate in the interface region, the third isolation region located at a second interface portion between the N-type well diffusion layer and the semiconductor substrate, a first guard ring provided on the surface of the semiconductor substrate in the interface region, the first guard ring located between the first and the second isolation regions, a second guard ring provided on the surface of the semiconductor substrate in the interface region, the second guard ring located between the first and the third isolation regions, a third guard ring provided on the surface of the semiconductor substrate in the interface region, the third guard ring located between the third isolation region and the peripheral circuit region, the method comprising:

forming an insulating film on the semiconductor substrate in the memory cell, the interface and the peripheral circuit regions;

forming a mask film above the insulating film;

forming a resist film on the mask film;

exposing the resist film by multiple exposures including a first exposure for forming a first latent image corresponding to the first pattern in the resist film and a second exposure for forming a second latent image corresponding to the second pattern in the resist film, a boundary area of the multiple exposures being set on a corresponding portion to one of the first, second and the third isolation regions, or one of the first and the second guard rings;

forming a resist pattern by developing the resist film; and forming a mask pattern by etching the mask film with the resist pattern;

etching the insulating film and the semiconductor substrate with the mask pattern to form a plurality of trenches; and forming isolation films in the trenches to form the first, the second and the third isolation regions.

2. The method for manufacturing the semiconductor device, according to claim 1, wherein the first exposure is higher in resolution than the second exposure.

3. The method for manufacturing the semiconductor device, according to claim 2, wherein the first and second exposures are carried out using an exposure apparatus comprising a replaceable part, and wherein the resolution of the exposure apparatus is varied by replacing the replaceable part.

4. A method for manufacturing a semiconductor memory device, the semiconductor device comprising a semiconductor substrate including a memory cell region having a first pattern, a peripheral circuit region having a second pattern being wider than the first pattern, and an interface region located between the memory cell region and the peripheral circuit region, a P-type well diffusion layer provided on a surface of the semiconductor substrate and surrounding the memory cell region, an N-type well diffusion layer provided on the surface of the semiconductor substrate and surrounding the P-type well diffusion layer, a first isolation region provided on the surface of the semiconductor substrate in the interface region, the first isolation region located at a first interface portion between the P-type and the N-type well diffusion layers, a second isolation region provided on the surface of the semiconductor substrate in the interface region, the second isolation region located between the first isolation region and the memory cell region, a third isolation region provided on the surface of the semiconductor substrate in the interface region, the third isolation region located at a second interface portion between the N-type well diffusion layer and the semiconductor substrate, a first guard ring provided on the surface of the semiconductor substrate in the interface region, the first guard ring located between the first and the second isolation regions, a second guard ring provided on the surface of the semiconductor substrate in the interface region, the second guard ring located between the first and the third isolation regions, a third guard ring provided on the surface of the semiconductor substrate in the interface region, the third guard ring located between the third isolation region and the peripheral circuit region, the method comprising:

forming a gate insulating film on the semiconductor substrate in the memory cell, the interface and the peripheral circuit regions;

forming a first conductive film on the gate insulating film;

forming a mask film on the first conductive film;

forming a resist film on the mask film;

exposing the resist film by a multiple exposures including a first exposure for forming a first latent image corresponding to the first pattern in the resist film and a second exposure for forming a second latent image corresponding to the second pattern in the resist film, a boundary area of the multiple exposures being set on a corresponding portion to one of the first, second and the third isolation regions, or one of the first and the second guard rings;

forming a resist pattern by developing the resist film;

forming a mask pattern by etching the mask film with the resist pattern;

etching the first conductive film, the gate insulating film and the semiconductor substrate with the mask pattern to form a plurality of trenches;

forming isolation films in the trenches to form the first, the second and the third isolation regions;

forming an inter-gate insulating film on separated conductive films and the first, second and the third isolation films;

forming a second conductive film on the inter-gate insulating film.

5. The method for manufacturing the semiconductor device, according to claim 4, wherein the first exposure is higher in resolution than the second exposure.

6. The method for manufacturing the semiconductor device, according to claim 5, wherein the first and second exposures is carried out using an exposure apparatus comprising a replaceable part, and wherein the resolution of the exposure apparatus is varied by replacing the replaceable part.

7. A method for manufacturing a semiconductor memory device, the semiconductor device comprising
- a semiconductor substrate including a memory cell region having a first pattern, a peripheral circuit region having a second pattern being wider than the first pattern, and an interface region located between the memory cell region and the peripheral circuit region,
- a P-type well diffusion layer provided on a surface of the semiconductor substrate and surrounding the memory cell region,
- an N-type well diffusion layer provided on the surface of the semiconductor substrate and surrounding the P-type well diffusion layer,
- a first isolation region provided on the surface of the semiconductor substrate in the interface region, the first isolation region located at a first interface portion between the P-type and the N-type well diffusion layers,
- a second isolation region provided on the surface of the semiconductor substrate in the interface region, the second isolation region located between the first isolation region and the memory cell region,
- a third isolation region provided on the surface of the semiconductor substrate in the interface region, the third isolation region located at a second interface portion between the N-type well diffusion layer and the semiconductor substrate,
- a first guard ring provided on the surface of the semiconductor substrate in the interface region, the first guard ring located between the first and the second isolation regions,
- a second guard ring provided on the surface of the semiconductor substrate in the interface region, the second guard ring located between the first and the third isolation regions,
- a third guard ring provided on the surface of the semiconductor substrate in the interface region, the third guard ring located between the third isolation region and the peripheral circuit region, the method comprising:

forming a dummy gate insulating film on the semiconductor substrate in the memory cell, the interface and the peripheral circuit regions;
forming a mask film on the dummy gate insulating film;
forming a resist film on the mask film;
exposing the resist film by a multiple exposures including a first exposure for forming a first latent image corresponding to the first pattern in the resist film and a second exposure for forming a second latent image corresponding to the second pattern in the resist film, a boundary area of the multiple exposures being set on a corresponding portion to one of the first, second and the third isolation regions, or one of the first and the second guard rings;
forming a resist pattern by developing the resist film;
forming a mask pattern by etching the mask film with the resist pattern;
etching the dummy gate insulating film and the semiconductor substrate with the mask pattern to form a plurality of trenches;
removing the dummy gate insulating film to expose the surface of the semiconductor substrate;
forming isolation films in the trenches to form the first, the second and the third isolation regions;
forming gate insulating films on the exposed surface of the semiconductor substrate;
forming first conductive films on the gate insulating films
forming an inter-gate insulating film on the first conductive films and the first, the second and the third isolation regions;
forming a second conductive film on the inter-gate insulating film.

8. The method for manufacturing the semiconductor device, according to claim 7,
wherein the first exposure is higher in resolution than the second exposure.

9. The method for manufacturing the semiconductor device, according to claim 8,
wherein the first and second exposures is carried out using an exposure apparatus comprising a replaceable part, and wherein the resolution of the exposure apparatus is varied by replacing the replaceable part.

* * * * *